TUNER FOR VERY HIGH AND ULTRAHIGH FREQUENCIES

Filed Dec. 29, 1953

INVENTOR.
DAVID C. FELT
BY Darby & Darby
ATTORNEYS 2,703,826

Patented Mar. 8, 1955

2,703,826

TUNER FOR VERY HIGH AND ULTRAHIGH FREQUENCIES

David C. Felt, West Englewood, N. J., assignor to Allen B. Du Mont Laboratories, Inc., Clifton, N. J., a corporation of Delaware Application December 29, 1953, Serial No. 400,914

6 Claims. (Cl. 200—6)

The present invention relates to improvements in a tuning device adapted for tuning to the ultra high frequency and very high frequency wave bands and particularly to such a device utilizing tuning and circuit disks, and constructed generally in accordance with the disclosure of my copending application Serial No. 314,851, filed October 15, 1952, and assigned to the assignee of the present invention.

More particularly still the invention relates to means for spacing and stabilizing the tuning and circuit disks both when in detented stationary position and during movement to effect band switching.

It is an object of the invention to provide a tuning device of the type having tuning and circuit disks and which is provided with means for maintaining the spacing between the two disks.

It is another object of the invention to provide such a device in which friction is minimized while the disks are rendered stable in operation.

It is a further object of the invention to provide such a device which is mechanically simple, reliable and economically manufactured.

Other objects and features of the invention will appear when the following description is considered in connection with the annexed drawings, in which.

Figure 1:
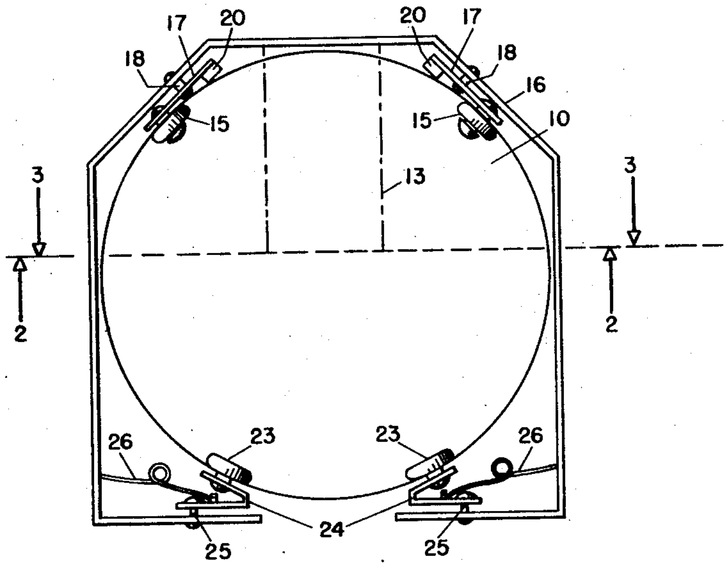
Figure 1 is a top plan view of a tuning device in accordance with my invention.
Figure 2:
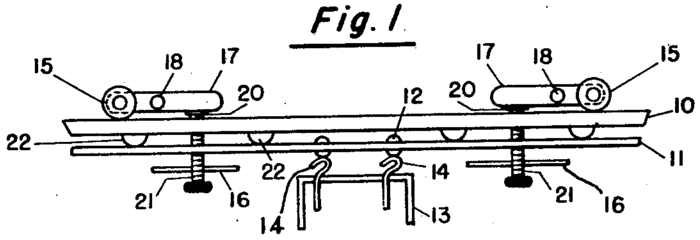
Figure 2 is a vertical section of the device, the view being taken on the plane of the line 2—2 of Figure 1.

Referring now to the drawings there is shown at 10 the tuning disk and at 11 the circuit disk of a tuning device of the type heretofore mentioned. The circuit disk is provided with the contacts 12 which contacts extend through the disk and at their upper side connect to printed circuit elements. Mounted beneath the disk 11 on a suitable bracket such as 13 are spring contacts 14 which cooperate with the contacts 12 of the circuit disk.

As in the devices of the prior copending application mentioned, the lower face of the tuning disk 10 carries shading elements (not shown) which cooperate with the tuning elements of the circuit disk to tune the circuit for reception of a particular desired wave band. Disks 10 and 11 are mounted in any suitable manner for rotation. They may, for example, be mounted respectively on a shaft, not shown, and on a sleeve surrounding that shaft.

In order to assure proper contact pressure between the contacts 14 and contacts 12 it is desirable that the disks 10 and 11 be pressed in a direction to increase the contact pressure between the contacts mentioned. In the present instance this is accomplished by means of two rollers 15 mounted on the housing 16 at opposite sides of the bracket 13. These two rollers are rotatably mounted on arms 17 pivoted at points 18 to the housing 16, the rollers bearing against the upper surface of the tuning disk 10. The arms 17 on which the rollers are mounted are provided with horizontally extending bent off portions or ears 20 at the ends opposite the rollers and screws 21 are threadedly mounted in portions of the housing 16 so that they may adjust the position of the disk 10 and assure that the contact pressure between contacts 12 and 14 will be sufficient.

Thus when the tuner is detented on a particular wave band the spring contacts 14 strike the contact rivets 12 and force the circuit disk 11 and the tuning disk 10 into proximity to each other and against the two adjustably mounted rollers 15. In order to assure the proper spacing between the two disks 10 and 11 the disk 10 is provided with a large number of protrusions 22 which are preferably molded integrally with the disk 11 at positions not occupied by the printed circuit shading elements.

Figure 3:
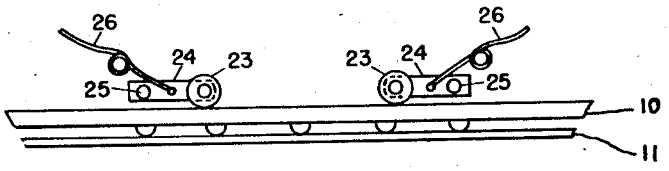
Figure 3 is another vertical cross-sectional view, this view being taken on the plane of the line 3—3 of Figure 1.

When changing bands the contact rivets 12 leave the contact springs 14 thus releasing the pressure on the assembly. It is desirable to stabilize the tuning disk 10 and circuit disk 11, and to thus prevent shifting and wobbling movement which would be detrimental to operation and apparent to the operator. In order to accomplish this a second set of rollers 23 are pivotally mounted on the ends of arms 24 which arms are pivotally mounted at points 25 on the housing 16 as shown particularly in Figure 3. Rollers 23 are urged against the periphery of the upper side of the tuning disk 10 by means of suitable springs 26 and thus, because of the support of the disk at its center, its position with respect to the spacing and positioning rollers 15 is maintained.

While I have described a preferred embodiment of the invention, it will be understood that I wish to be limited not by the foregoing description, but solely by the claims granted to me.

What is claimed is:

1. Means for stabilizing the operation of a tuning device of the type having coaxially mounted circuit and tuning disks and in which the circuit disk carries contacts which engage spring contacts on a stationary element, said means comprising rollers bearing against the periphery of said tuning disk, said rollers being mounted for adjustment in a direction parallel to the axis of the disks, and projections on the face of the tuning disk adjacent the circuit disk whereby contact pressure between the circuit disk contacts and stationary contacts and spacing between the two disks is maintained while the circuit disk is stationary and the disks are freely rotatable between the stationary tuning positions.

2. A device as claimed in claim 1, characterized in that said rollers are located adjacent to and on opposite sides of the stationary contact-supporting element.

3. A device as claimed in claim 1, characterized in that a second pair of rollers bears against the periphery of the tuning disk, each one of said rollers being substantially diametrically opposite one of the rollers of the first-mentioned pair.

4. A device as claimed in claim 3, characterized in that said second pair of rollers are mounted on pivotally mounted arms.

5. A device as claimed in claim 4, characterized in that said pivotally mounted arms are spring urged in a direction to urge said rollers against the periphery of the tuning disk.

6. A device as claimed in claim 5, characterized in that the rollers of said first pair are mounted on pivoted arms, said pivoted arms terminating in bent-over ears at ends remote from the rollers, and further characterized in that screw members bear against said ears to adjust the position of said rollers.

References Cited in the file of this patent

UNITED STATES PATENTS 2,543,560 Thias ---------------- Feb. 27, 1951